US006407393B1

(12) United States Patent
Kim et al.

(10) Patent No.: US 6,407,393 B1
(45) Date of Patent: Jun. 18, 2002

(54) X-RAY IMAGE SENSOR AND METHOD FOR FABRICATING THE SAME

(75) Inventors: Chang Won Kim, Seoul; Chang Yeon Kim, Kyonggi-do; Young Sik Jeong, Seoul; Jung Kee Yoon; Jae Beom Choi, both of Kyonggi-do, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/536,635

(22) Filed: Mar. 28, 2000

(30) Foreign Application Priority Data

Apr. 1, 1999 (KR) .............................................. 99-11516

(51) Int. Cl.$^7$ ................................................. G01T 1/24
(52) U.S. Cl. ................................................. 250/370.09
(58) Field of Search ................................ 250/370.09

(56) References Cited

U.S. PATENT DOCUMENTS 5,498,880 A    3/1996  Lee et al.
6,060,714 A  * 5/2000  Zhong et al. .......... 250/370.09

FOREIGN PATENT DOCUMENTS

JP           H6-202153        7/1994

* cited by examiner

Primary Examiner—Constantine Hannaher
(74) Attorney, Agent, or Firm—Long Aldridge & Norman LLP

(57) ABSTRACT

An X-ray image sensor which includes: a photoelectric conversion part effecting electric charges in accordance with received amount of X-ray; a pixel electrode for collecting the electric charges; a storage capacitor for storing the electric charges collected in the pixel electrode, having a first capacitor electrode, a dielectric layer deposited on the first capacitor electrode and a second capacitor electrode on the dielectric layer, the second capacitor electrode contacting the pixel electrode through a first contact hole formed in a protection film on the second capacitor electrode; and a switching part controlling release of electric charges stored in the storage capacitor to an outer circuit. By the present invention, the switching characteristics of the TFT is enhanced by way of forming a two-layered protection film of silicon nitride and BCB on the channel portion of TFT, the capacity of the parasitic capacitor, which exists between the pixel electrode and the TFT, can be decreased.

30 Claims, 9 Drawing Sheets

X-RAY IMAGE SENSOR AND METHOD FOR FABRICATING THE SAME

CROSS REFERENCES TO RELATED APPLICATIONS

This application claims the benefit of Korean Patent Application No. 1999-11516, filed on Apr. 1, 1999, which is hereby incorporated by reference for all purposes as if fully set forth herein.

BACKGROUND OF THE INVENTION (1) Field of the Invention

The present invention relates to an X-ray image sensor, and more particularly to an X-ray image sensor fabricated utilizing a TFT (Thin Film Transistor) array process and a method for fabricating the same.

(2) Description of Related Art

An X-ray detection method that has been widely used for medical diagnosis is such that an X-ray detecting film is used to produce a photograph and some predetermined printing procedures are required to obtain the result.

However, digital X-ray detectors employing TFT (Thin Film Transistor) have been developed recently due to the development of semiconductor technology. This X-ray image sensor has an advantage that a real time diagnosis can be obtained immediately after photographing because it uses a TFT as switching element.

FIG. 1 is a schematic cross-sectional view illustrating the structure and operation of an X-ray image sensing device 100 which comprises a lower substrate 1, a thin film transistor 3, a storage capacitor 10, a pixel electrode 12, a photoconductive film 2, a protection film 20, a conductive electrode 24 and a high voltage D.C. (direct current) power supply 26.

Photoconductive film 2 produces internal electric signals, i.e. electron-hole pairs in proportion to the strength of external signals such as incident electromagnetic waves or magnetic waves. That is, the photoconductive film 2 serves as a converter to detect external signals, particularly X-rays and convert them into electric signals. Either electrons or holes are gathered at pixel electrode 12 located beneath the photoconductive film 2 depending on a voltage (Ev) applied to the conductive electrode 24 by the high voltage D.C. power supply 26, and then are stored in storage capacitor 10 formed in connection with a ground line grounded externally. Charges stored in the storage capacitor 10 are transferred to the TFT 3, controlled externally, to an external image display device and form X-ray images.

In an X-ray image sensing device, to detect and convert even the weakest X-ray into electric charges, it is required to decrease the trap state density for the electric charge in the photoconductive film 2 and to decrease the amount of current in the non-vertical direction by applying a relatively high voltage (more than $10V/\mu m$) in the vertical direction between the conductive electrode 24 and pixel electrode 12.

Electric charges in the photoconductive film 2 produced by X-ray energy are trapped and gathered on the pixel electrode 12. Even during the OFF state of the TFT 3, electric charges trapped and gathered on the pixel electrode 12, particularly over the channel region of the TFT 3, induce a potential difference between the TFT 3 and the pixel electrode, which causes the same effect in the TFT 3 as ON state. That is, the pixel electrode 12 functions as a gate of the TFT 3, thus, adversely affecting the switching operation of the TFT 3 and increasing leakage current through the TFT 3 even when in an OFF state. This results in an undesired image.

FIG. 2 is a cross-sectional view schematically illustrating a conventional X-ray image sensor. U.S. Pat. No. 5,498,880 discloses one kind of structure wherein the pixel electrode 12 extends to cover the upper part of TFT 3 (a so called "mushroom structure") to prevent the trapping of electric charges in the upper part of TFT 3 induced from the electric charges produced in photoconductive film 2 by X-ray energy.

The manufacture of the conventional X-ray image sensor will be described hereinafter referring to FIG. 2.

First, substrate 1 is deposited with a metal and patterned to form a gate electrode 31. Then, SiNx is deposited thereon in a thickness of about 100 nm to form a first insulation film 34a. After the formation of film 34a, a transparent conductive material is deposited and patterned to form a first capacitor electrode 40. ITO (indium tin oxide) is most commonly used as the transparent conductive material.

After forming the first capacitor electrode 40, a second insulation film 34b is formed on the first insulation film 34a while covering the first capacitor electrode 40. At a predetermined position of the second insulation film 34b on the first capacitor electrode 40, a contact hole 41 is formed for contact with a ground line 42 that will be formed later. Thereafter, a source/drain metal material is deposited and patterned to form a source electrode 33, a drain electrode 32 and the ground line 42. The source/drain metal is usually aluminum that has a low resistance and good deposition properties. Protection film 46 is formed after the formation of 33, 32 and 42, in order to protect TFT 3 from external impact or humidity.

In the protection layer 46 on the source electrode 33, contact holes are formed for contact with the pixel electrode that will be formed later. Then, the protection layer 46 formed in the upper part of the first capacitor electrode 40, except on ground line 42, is etched out in order to decrease the thickness of the dielectric layer and increase the capacity of the storage capacitors. Then, ITO is deposited and patterned to form a pixel electrode 12 which serves as second capacitor electrode, and a photoconductive film 2 is formed by deposition over the whole substrate 1. The later procedures are abbreviated here.

In an X-ray image sensor adopting the so-called "mushroom structure" as described above, electric charges produced by X-ray energy gather on the pixel electrodes and there is formed a parasitic capacitor between pixel electrode and TFT.

The capacity of a parasitic capacitor has an inverse relationship with respect to the thickness of the protection film for protecting the channel part in the upper part of TFT such that it increases as the thickness is decreased, inducing a large amount of charges to the channel part, which increases the amount of leakage current even if TFT is in an "off" state and deteriorates its switching operation.

Though the capacity of the parasitic capacitor of the TFT may be decreased when the thickness of the protection film made of acrylic on the TFT is increased, in the above structure there is a limit to reduce the capacity of the parasitic capacitor, since the dielectric constant of acrylic is relatively high.

Furthermore, the second insulation film used as a dielectric of the storage capacitor is formed to be thin, with a thickness of about 200 nm in a conventional X-ray image sensor. Therefore the second insulation film may be etched out or overetched while etching the organic insulation film as a protection film in order to form a contact hole for contacting the pixel electrode, or the second capacitor electrode and the second insulating film to decrease the thickness of the dielectric layer. This causes an electrical short of the first and second capacitor electrodes and accordingly the number of point defects is increased, leading to low yield. The present invention has been developed as a result of the continuous research done by the inventors for solving the above-described problems.

SUMMARY OF THE INVENTION

An object of the present invention is to provide an X-ray image sensor in which the "off" electric current is decreased by lowering the leakage current of a TFT.

Another object of the present invention is to provide an X-ray image sensor which can prevent electrical shorts between gate and source/drain electrodes and a capacitor electrode.

A further object of the invention is to provide an X-ray image sensor which can decrease processing errors which may occur in the production process.

In order to achieve the above objects, the present invention provides, in a first aspect, an X-ray image sensor which comprises: a photoelectric conversion part affecting electric charges in accordance with a received amount of X-ray energy; a pixel electrode for collecting the electric charges; a storage capacitor for storing the electric charges collected in the pixel electrode, having a first capacitor electrode, a dielectric layer deposited on the first capacitor electrode, and a second capacitor electrode on the dielectric layer, the second capacitor electrode contacting the pixel electrode through a first contact hole formed in a protection film on the second capacitor electrode; and a switching part controlling release of electric charges stored in the storage capacitor to an external circuit.

In a second aspect, the present invention also provides an X-ray image sensor which comprises: a photoelectric conversion part affecting electric charges in accordance with received amount of X-ray; a pixel electrode for collecting the electric charges; a storage capacitor for storing the electric charges collected in the pixel electrode; and a thin film transistor for controlling release of electric charges stored in the storage capacitor to an external circuit, having gate, source and drain electrodes, wherein the pixel electrode extends over the thin film transistor, and a protection film made of benzocyclobutene lies therebetween.

In a third aspect, the present invention also provides a method for fabricating an X-ray image sensor, comprising the steps of: forming a gate electrode on a substrate; forming a first insulation film on the substrate while covering the gate electrode; forming a source island and first capacitor electrode on predetermined positions of the first insulation film; forming an active layer on the first insulation film over the gate electrode so that the active layer overlaps one end of the source island; forming on the active layer, a drain electrode and a source electrode contacting a portion of the source island and forming a ground line on the first capacitor electrode; depositing a second insulation film on the first capacitor electrode while covering the ground line and the source and drain electrodes; forming a second capacitor electrode on the second insulation film over the first capacitor electrode; depositing an organic protection film on the second insulation film and on the second capacitor electrode; forming contact holes by etching the organic protection and second insulating films so that a portion of the source island and source electrode and a portion of the second capacitor electrode are exposed; forming on the organic protecting film a pixel electrode in contact with the source island and source electrode, and the second capacitor electrode though the contact holes, forming a photoconductive film on the pixel electrode; and forming a conductive electrode on the photoconductive film.

In a fourth aspect, the present invention provides a method for fabricating an X-ray image sensor, comprising the steps of: forming a gate electrode on a substrate; forming a first insulation film on the substrate while covering the gate electrode; forming an active layer on the first insulation film over the gate electrode; forming a drain electrode and a source electrode on the active layer and a grounding line on the first capacitor electrode; forming a source island overlapping the source electrode and a first capacitor electrode covering the ground line on the first insulating film; depositing a second insulation film on the first capacitor electrode while covering the ground line and the source and drain electrodes; forming a second capacitor electrode on the second insulation film over the first capacitor electrode; depositing an organic protection film on the second insulation film and on the second capacitor electrode; forming contact holes by etching the organic protection and second insulating films so that a portion of the source island and source electrode and a portion of the second capacitor electrode may be exposed; forming on the organic protecting film; a pixel electrode in contact with the source island and source electrode and the second capacitor electrode though the contact holes, forming a photoconductive film on the pixel electrode; and forming a conductive electrode on the photoconductive film.

The area of the first capacitor electrode is larger than that of the second capacitor electrode and vice versa.

The second capacitor electrode of the storage capacitor is made of transparent conducting material.

The transparent conducting material for the second capacitor electrode is indium tin oxide.

The switching part is a thin film transistor having gate, source and drain electrodes, the source electrode contacting the pixel electrode through a source island, thereby decreasing contact resistance between the source electrode and the pixel electrode.

The source island is made of transparent conducting material.

The transparent conducting material for the source island is indium tin oxide.

The protection film is an organic insulation film.

The organic insulation film is made of a material selected from the group consisting of BCB (benzocyclobutene), acrylic and polyamide.

The storage capacitor further includes a grounding line contacting the first capacitor electrode in order to reset the storage capacitor.

The pixel electrode contacts the second capacitor electrode through a second contact hole in the protection film over the grounding line.

The grounding line is located on the first capacitor electrode of the storage capacitor and vice versa.

The gate electrode of the thin film transistor is two-layered.

The lower layer for the gate electrode is made of aluminum or aluminum alloy and a upper layer for the gate electrode is selected from a group consisting of molybdenum(Mo), tantalum(Ta), tungsten(W), niobium (Nb) and antimony(Sb).

The pixel electrode is formed on the organic protecting film while extending over the active layer.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Disclosed herein is an X-ray image sensor which comprises a photoelectric conversion part affecting electric charges in accordance with the received amount of light; a charge storage part (storage capacitor) having a first capacitor electrode, a dielectric layer deposited on the first capacitor electrode, a second capacitor electrode on the dielectric layer, a protection film having more than one contact hole(s) on the second capacitor electrode and a pixel electrode formed on the protection film and in contact with the second capacitor electrode through the contact hole(s) and collecting the electric charges produced in the photoelectric conversion part; and a switching part controlling the release of electric charges stored in the storage capacitor.

The switching part is a TFT comprised of a gate electrode, a drain electrode and a source electrode contacting with the pixel electrode of the charge storage part.

Figure 3:
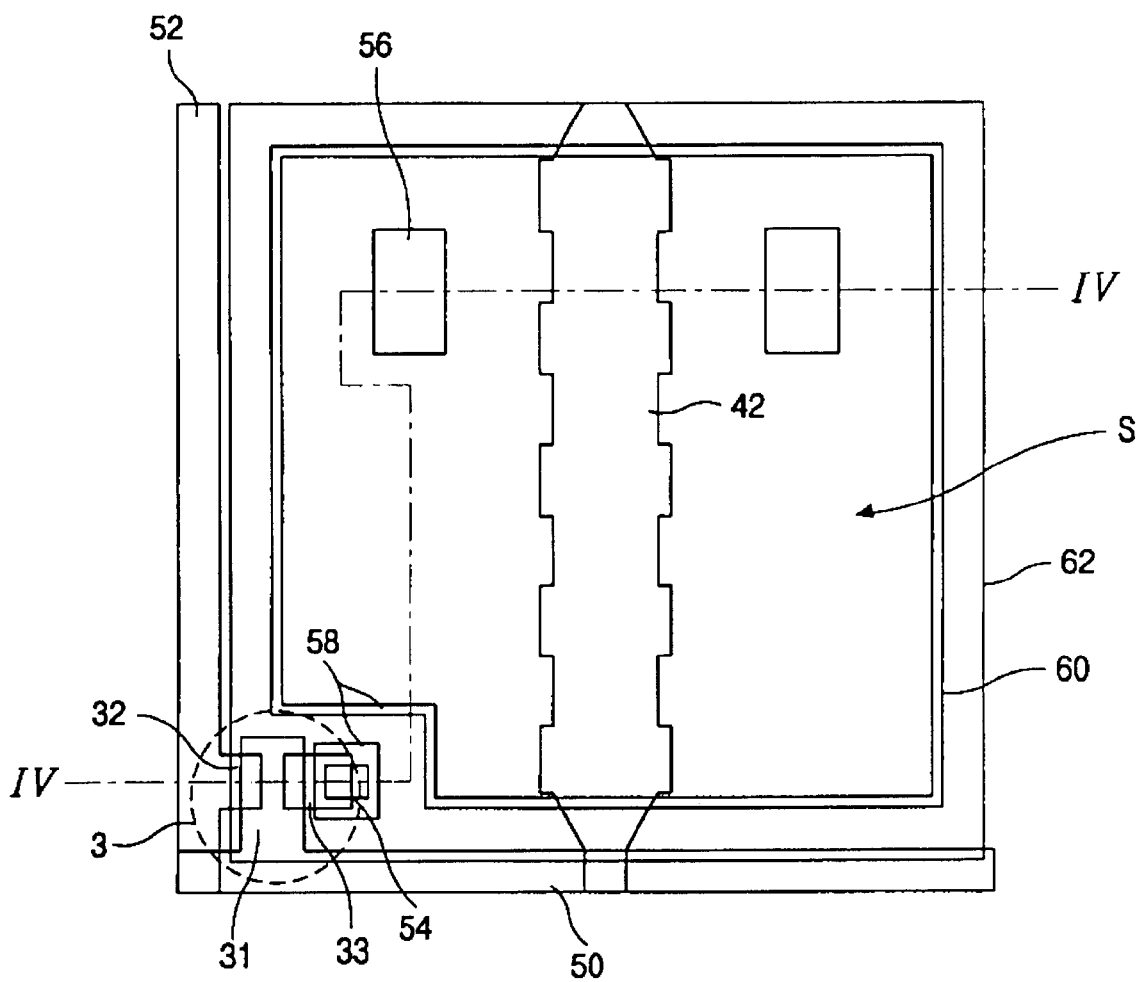
FIG. 3 is a plan view illustrating one pixel of an X-ray image sensor according to first and second embodiments of the invention.

FIG. 3 is a plan view illustrating one pixel of an X-ray image sensor panel according to a first embodiment of the invention, which has a TFT 3, a storage capacitor "S" and a pixel electrode 62 which collects charges.

The TFT 3 is comprised of a gate electrode 31 elongated from a gate line 50 and a drain electrode 32 elongated from a drain line 52.

The storage capacitor "S" is comprised of first and second capacitor electrodes 58 and 60 that are transparent. A ground line 42 is disposed as a common electrode grounded commonly with the adjacent pixels. There are also shown first and second contact holes 54 and 56 for contacting the pixel electrode 62 and the source electrode 33 of the TFT 3 and for contacting the pixel electrode 62 and the second capacitor electrode 60, respectively.

FIGS. 4a to 4i are sectional views taken along the line IV—IV of FIG. 3 illustrating a manufacturing process of the X-ray image sensor shown in FIG. 3.

Figure 4A:
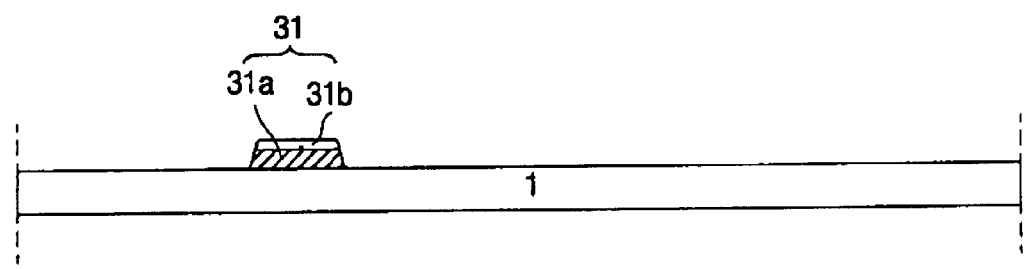
FIGS. 4a to 4i are processing diagrams corresponding to a cross-section of FIG. 3 (IV—IV) and sequentially illustrating the manufacture of an X-ray image sensor according to the first embodiment.

A substrate 1 is deposited with a first metal layer 31a such as aluminum or aluminum alloy. The substrate 1 is preferably a glass panel, since a quartz panel with a high melting point is expensive. A second metal layer 31b of a high melting point such as molybdenum (Mo), tantalum (Ta), tungsten (W), niobium (Nb) or antimony (Sb) is continuously deposited thereon. First and second metal layers are patterned to form a two-layered gate electrode 31, as shown in FIG. 4a.

Figure 4B:
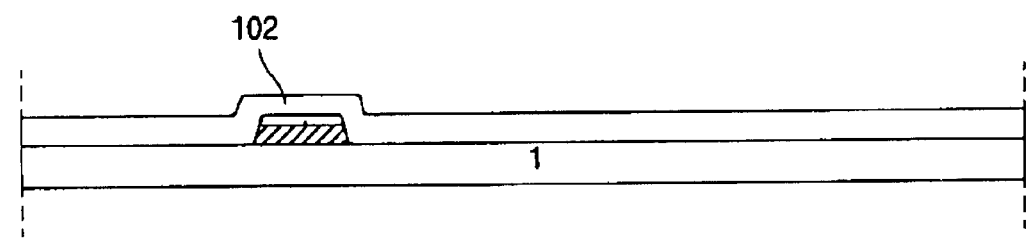

FIG. 4b illustrates the deposition step of a first insulation film. A gate insulation film 102 is formed by deposition of an inorganic insulation film such as a silicon nitride ($SiN_x$) film or silicon oxide ($SiO_x$) film having a thickness of $4000 \times 10^{-10}$ m, or 4000 Å, or in some cases, by application of an organic insulation material such as BCB (benzocyclobutene) or acrylic resin. In the preferred embodiment of the present invention, deposition of a silicon nitride film is employed.

Figure 4C:
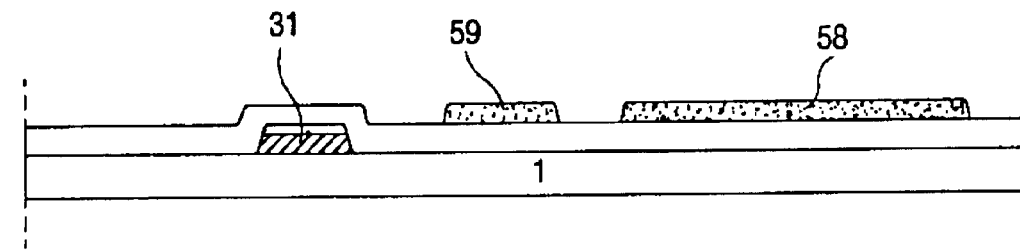

Then, as illustrated in FIG. 4c, a first capacitor electrode 58 is formed using a transparent electrode material such as ITO. And, a source island 59 is formed spaced between the first capacitor electrode 58 and gate electrode 31, for decreasing the contact resistance resulting from the reciprocal contact between source electrode and pixel electrode which will be formed later.

Figure 4D:
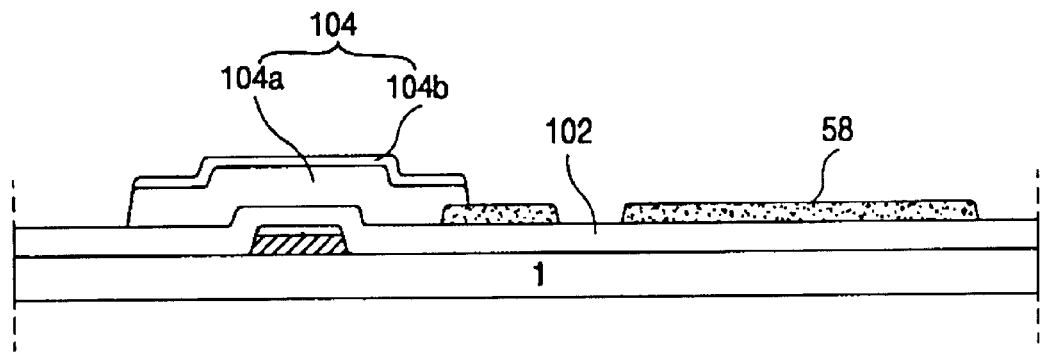

FIG. 4d illustrates the formation of a semiconductor layer 104 on the insulation film 102. A semiconductor film 104a such as pure amorphous silicon film and a doped amorphous silicon film 104b are continuously deposited. Though either vapor deposition or ion injection can be used for the formation of the doped amorphous silicon film 104b, vapor deposition is employed in the preferred embodiment.

Figure 4E:
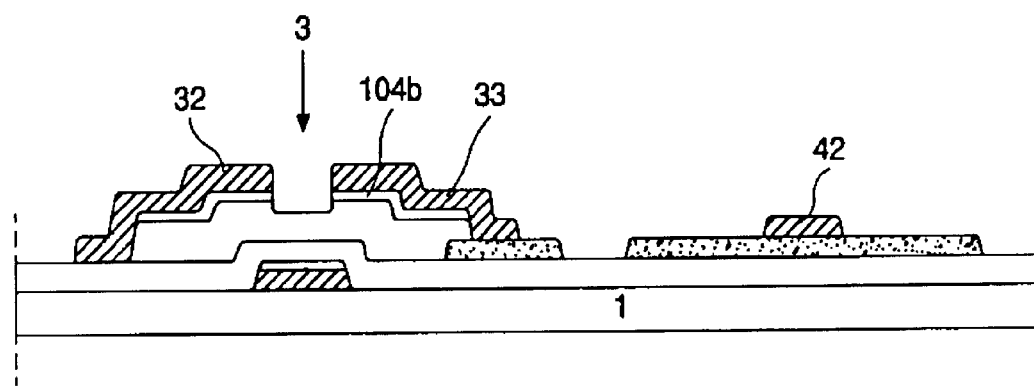

Next a third metal layer is formed, i.e. source and drain electrodes 33 and 32 and ground line 42. For this, a metal such as chromium (Cr) or chromium alloy (Cr alloy) is deposited and patterned to form a source electrode 33, drain electrode 32 and grounding line 42 (FIG. 4e).

Figure 4F:
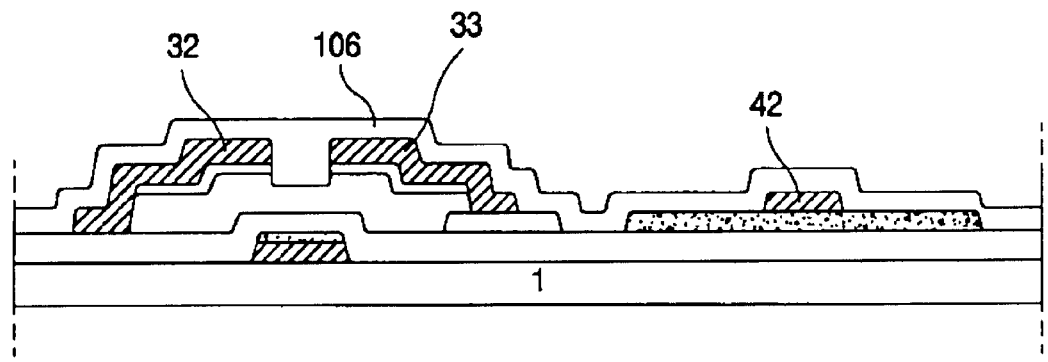

After this procedure, a silicon nitride film having a thickness of $3000 \times^{-10}$ m, or 3000 Å is deposited as a second insulation film on the source/drain electrodes 33 and 32 and the ground line 42, thereby forming an insulating film 106 functioning as a dielectric of the storage capacitor and protecting the TFT 3 (FIG. 4f).

Figure 4G:
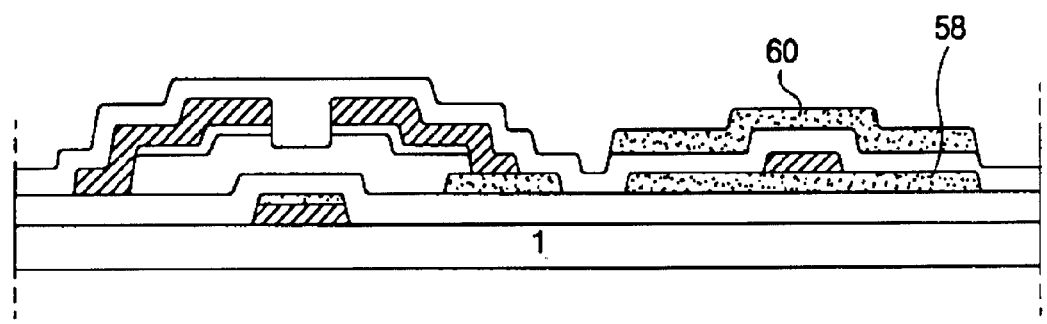

Then, a second capacitor electrode 60, i.e. the second transparent electrode, is formed over the first capacitor electrode 58, being the same as, or a little larger than the first capacitor electrode (FIG. 4g).

Figure 4H:
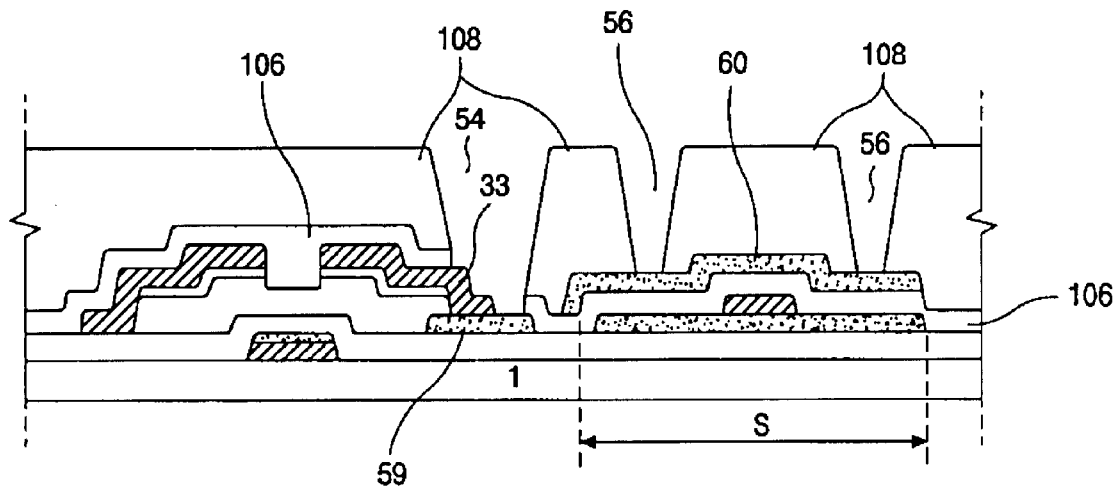

As shown in FIG. 4h, a protection film 108 is formed as a third insulating film. Organic BCB (benzocyclobutene) is used for it in the preferred embodiment. BCB is a material of a lower dielectric constant than the conventionally used silicon nitride, silicon oxide or acrylic resin.

After the formation of protection film 108, first and second contact holes 54 and 56 are formed. The first contact hole 54 exposes a portion of the source electrode 33 and source island 59. The second contact hole 56 exposes a portion of the second capacitor electrode 60. Though the first contact hole penetrates to the source island 59 below the second insulating layer 106, the second contact hole can not reach it, since the second capacitor electrode 60 serves as a means to prevent the second insulation film 106 from being overetched while etching the protection film 108.

Figure 1:
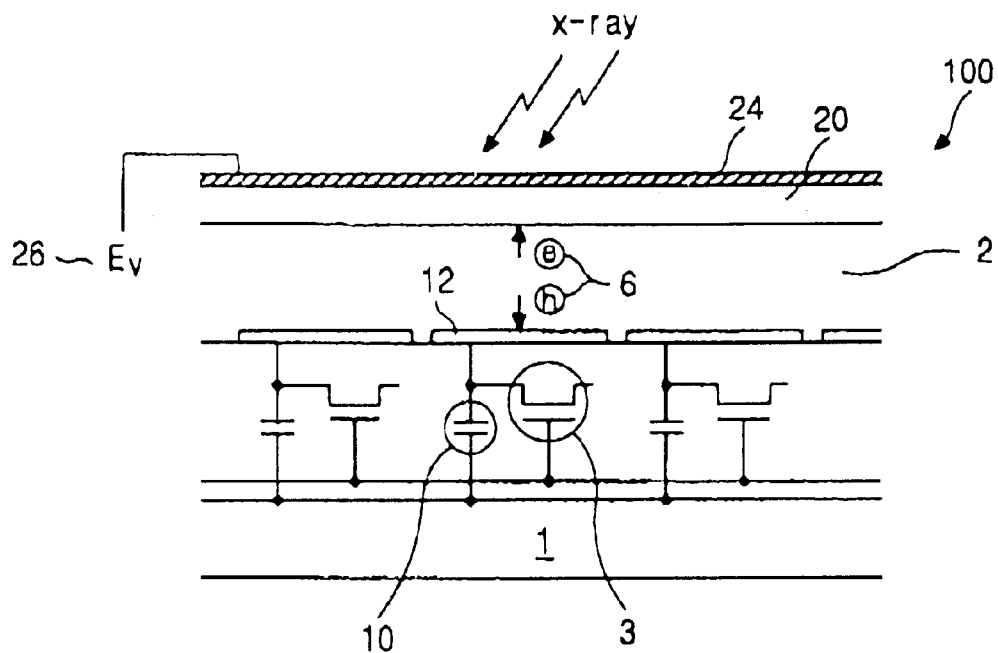
FIG. 1 is a cross-sectional view illustrating principles of operation of an X-ray image sensor.
Figure 2:
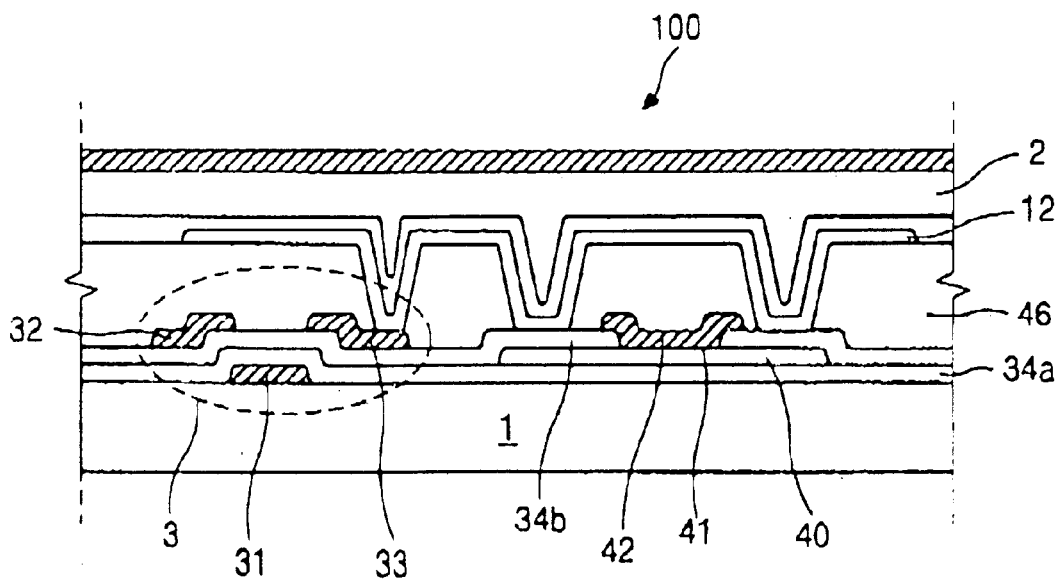
FIG. 2 is a sectional view illustrating a cross-section of one pixel of a conventional X-ray image sensor.

Referring back to FIG. 2, which illustrates a cross-section of the conventional X-ray image sensor, the insulation film layer is formed thickly as a dielectric layer for preventing overetching while etching the protection film out for the second contact hole, which may cause a low capacity of the storage capacitor and point defects. But, in the embodiment of the present invention, the second capacitor electrode 60 is used as an etch-stopper. And by adopting the second capacitor electrode 60, the area of the substantial dielectric layer can be increased, thus, the dielectric layer can be thicker than before without decreasing the capacity of the storage capacitor "S". Therefore, the possibility of shorts between the first and second capacitor electrodes can be prevented and the occurrence of point defects can be minimized.

Figure 4I:
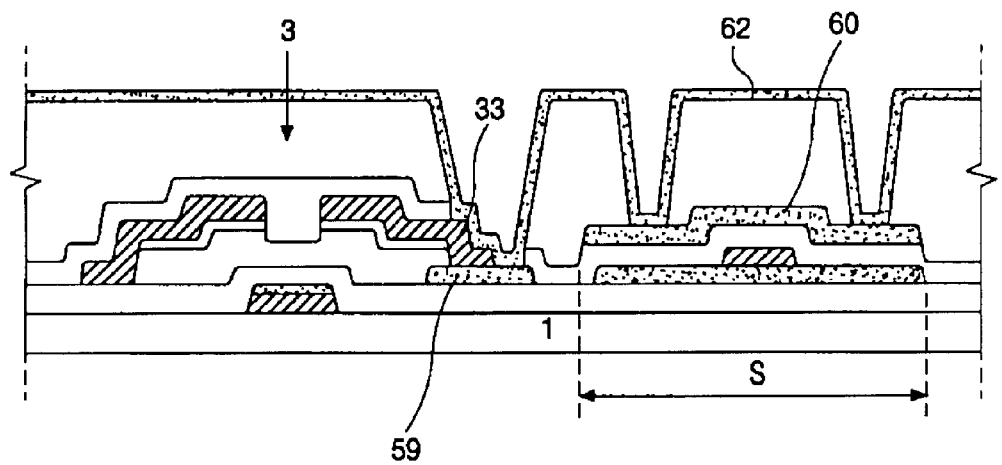

FIG. 4*i* illustrates the step of forming a pixel electrode 62 as a third transparent electrode layer, in which first and second contact holes 54 and 56 formed in the process of FIG. 4*h* are filled by deposition of the third transparent electrode layer. Therefore, the pixel electrode 62 is made to electrically contact with the source electrode 33, source island 59 and second capacitor electrode 60. In addition, the pixel electrode 62 is formed extended to cover the upper part of the TFT 3 to constitute a "mushroom" structure.

Though not illustrated, the next step is to apply a light-sensitive material used as a converter to receive an external signal and convert it to an electric signal. An amorphous selenium compound is deposited in a thickness of 100 to 500 $\mu$m by an evaporator. An X-ray-sensitive material having low dark conductivity and sensitive to external signals, for example $HgI_2$, $PbO_2$, CdTe, CdSe. Thallium bromide and cadmium sulfide, can be used as well. When a light-sensitive material is exposed to X-ray energy, electron-hole pairs are produced in the light-sensitive material in accordance with the strength of the irradiated X-rays.

After the application of the X-ray-sensitive material, a transparent conductive electrode that transmits X-rays is formed. When a voltage is applied to the conductive electrode while X-ray is being irradiated by X-rays, electron-hole pairs formed in the light-sensitive material are separated into electrons and holes, and the holes separated by the conductive electrode are gathered to the pixel electrode 62 and stored in the storage capacitor "S".

The second embodiment according to the invention is a method in which the sequence of the processes of the first embodiment is modified. The sequence is changed in the steps described in FIGS. 4*c* to 4*e* that illustrate the manufacture of the first embodiment.

Figure 5:
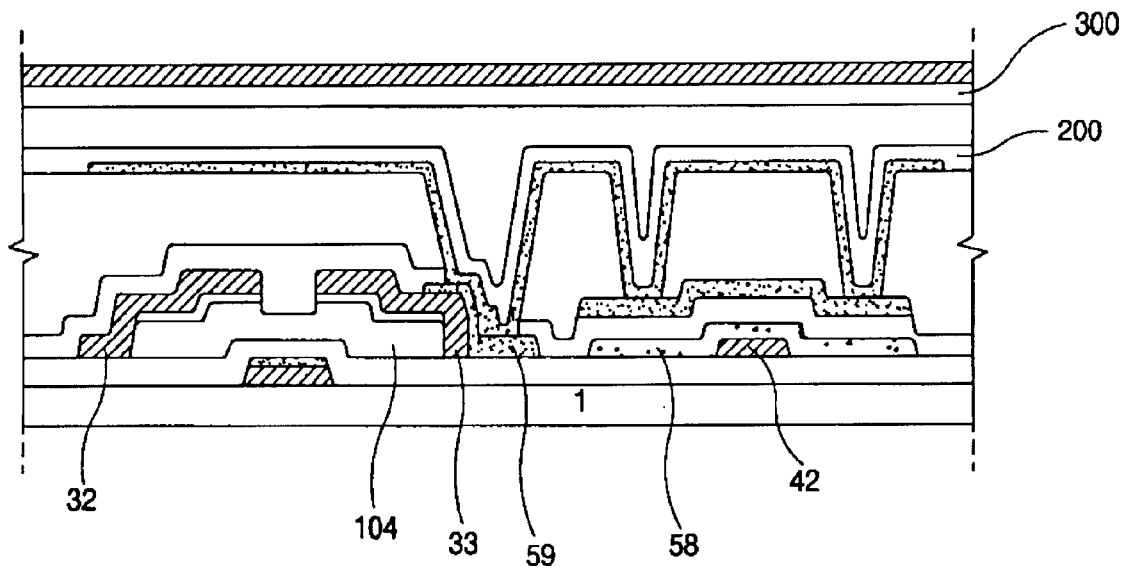
FIG. 5 is a cross-sectional view illustrating an X-ray image sensor according to the second embodiment of the invention.

Description is made referring to FIG. 5 illustrating a cross-section of an X-ray image sensor according to the second embodiment and the processing diagrams FIGS. 4*a* to 4*i*.

After the process of FIG. 4*b*, a semiconductor layer 104 is deposited. Then, the third metal layer is deposited and patterned to form source and drain electrodes 33, 32 and ground line 42.

Thereafter, ITO is deposited as a transparent electrode material and patterned to form a first capacitor electrode 58 while covering the grounding line 42. In addition, a source island 59 is formed as covering a portion of the source electrode.

The later process is same as that of FIG. 4*f*.

That is, as illustrated in FIG. 5, in the manufacturing process of the X-ray image sensor according to the second embodiment the source island 59 is formed after formation of source electrode 33, and the first capacitor electrode 58 is formed after formation of grounding line 42.

Figure 6:
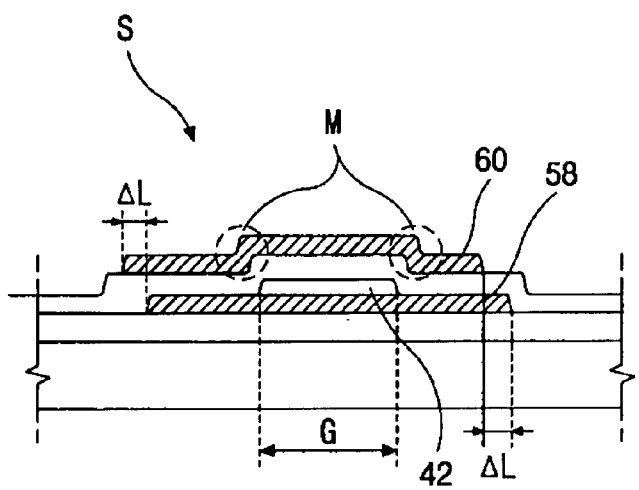
FIG. 6 is a cross-sectional view of an enlarged scale for the storage capacitor.

FIG. 6 is a cross-sectional view of an enlarged scale for the storage capacitor "S" part of FIG. 4*i*, the final processing diagram according to the first embodiment. As illustrated in FIG. 6, "M" portions of the second capacitor electrode 60 may have an open line because of the step difference owing to the grounding line 42 on the first capacitor electrode 58.

In case the "M" portions have an open line, the "G" region of FIG. 6 cannot function as the storage capacitor "S", since in the "G" region there is no contact hole for connecting the second capacitor electrode and the pixel electrode in the "M" portion. Thus, the capacity of the storage capacitor (S) becomes less by the width of the ground line.

In addition, a processing error $\Delta L$ may occur due to misalignment. Misalignment may cause the first capacitor electrode 58 and second capacitor electrode 60 to be dislocated by $\Delta L$. This causes the capacity of electric charges to be stored in the storage capacitor "S" to be reduced by the misalign $\Delta L$.

The third embodiment is a structure to prevent such capacity decrease of the storage capacitor.

Figure 7:
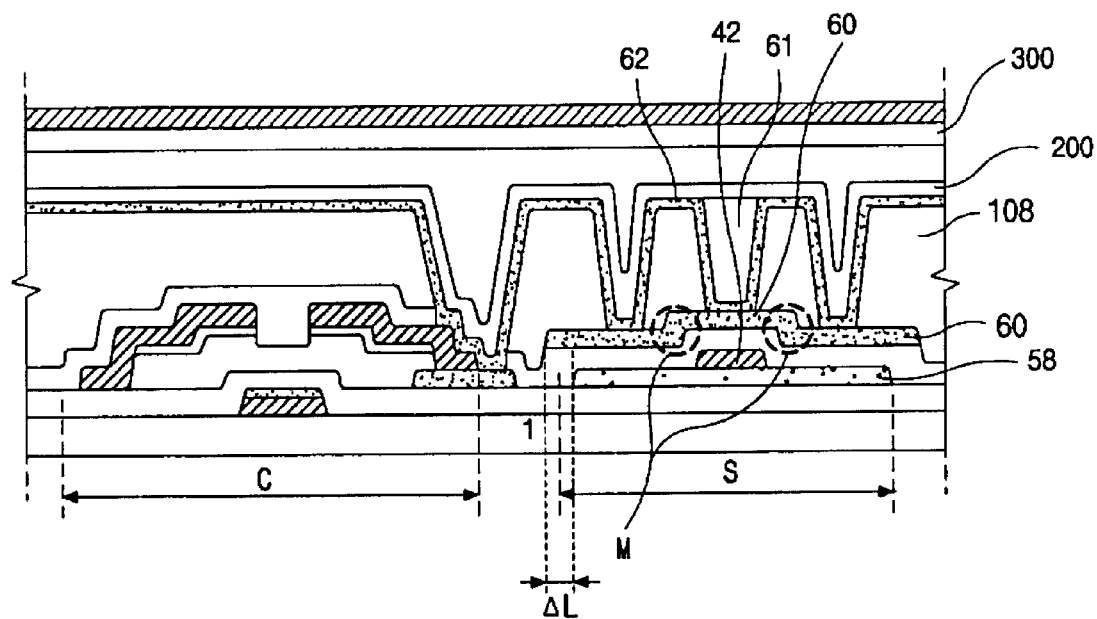
FIG. 7 is a cross-sectional view illustrating an X-ray image sensor according to the third embodiment of the invention.

FIG. 7 is a cross-sectional view of an X-ray image sensor according to the third embodiment. As shown in the figure, the second capacitor electrode 60 is larger than the first capacitor electrode 58, or vice versa, by an amount sufficient to prevent the capacity decrease of storage capacitor "S" owing to the possible misalign $\Delta L$.

A storage capacitor without capacity variation is now constructed by forming an enlarged first or second capacitor electrode to compensate for the processing error.

In addition, a third contact hole 61 is formed in the protection film 108 over the ground line 42 such that the pixel electrode 62 may contact the second capacitor electrode 60 over the ground line 42. Then, the capacity decrease of the storage capacitor "S" does not occur since a portion of the second capacitor electrode over the ground line 42 is electrically connected with the pixel electrode 62, even if the step difference portion M has an open line.

Figure 8:
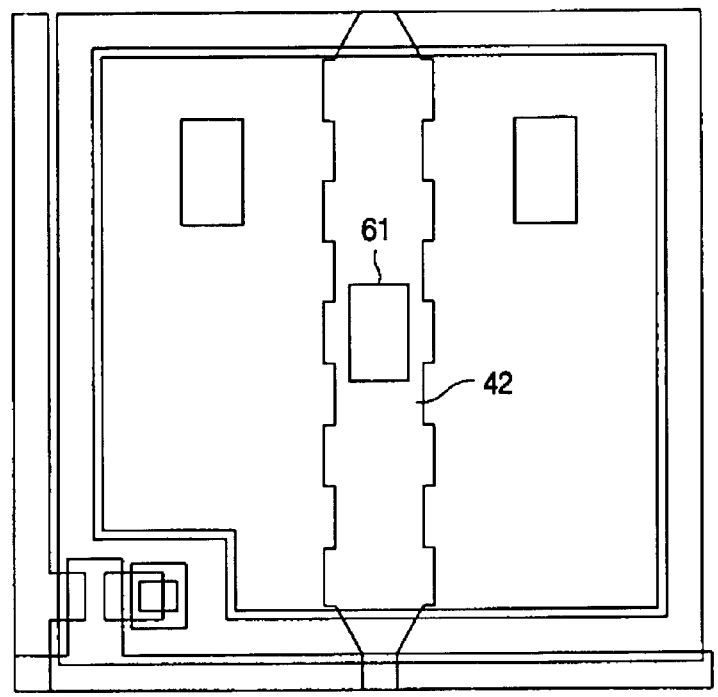
FIG. 8 is a plan view illustrating one pixel of an X-ray image sensor according to the third embodiment of the invention.

FIG. 8 is a plan view of one pixel of an X-ray image sensor according to the third embodiment, clearly showing a third contact hole 61 over the ground line 42.

Figure 9:
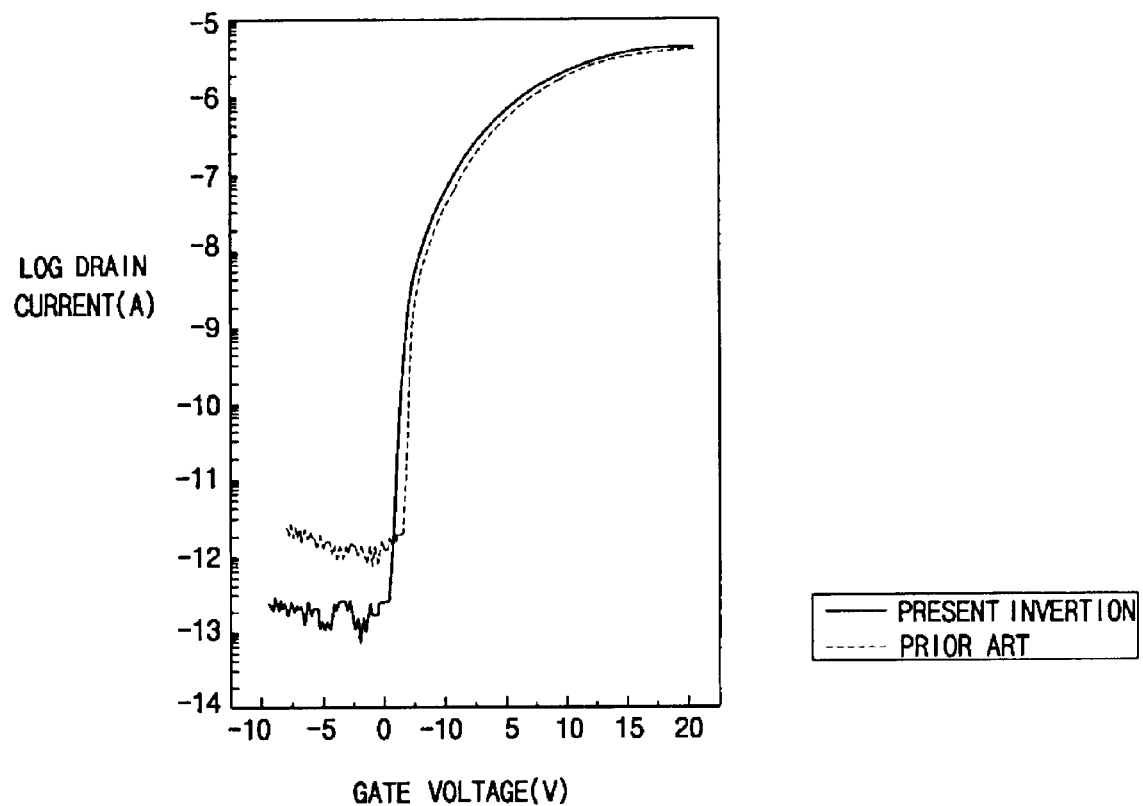
FIG. 9 is a graph illustrating a comparison of the "on-off" characteristics of the TFT according to the invention and a TFT according to the prior art.

FIG. 9 is a graph illustrating the relationship between gate voltage and drain current according to the preferred embodiment and prior art, comparatively. From the figure, it can be seen that the TFT according to the invention has a lower leakage current, and a stable gate voltage swing that provides stable-switching operation. This is because the TFT is protected by a two-layered structure of the second insulation film and third insulation film of BCB. Therefore, the X-ray image sensor has better switching characteristics than that of the prior art.

According to the present invention, the following advantages may be obtained. By forming a two-layered protection film of silicon nitride and BCB on the channel portion of the TFT, the capacity of the parasitic capacitor, which exists between the pixel electrode and the TFT, can be decreased, thus enhancing the switching characteristics of the TFT. The second occurrence of electrical shorts between first and second capacitor electrodes, a cause of point defects, are inhibited by preventing overetching of the dielectric layer using the second capacitor electrode as an etch-stopper, and by increasing the thickness of the dielectric layer by adopting the second capacitor electrode. In addition, since the dielectric layer can be thicker than the prior art, the parasitic capacitor between the pixel electrode and the TFT can be decreased.

Further, since one of the first and second capacitor electrodes is larger than the other electrode to compensate for possible misalignment AL, the storage capacitor does not suffer from a capacity decrease.

Other embodiments and advantages of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An x-ray image sensor, comprising:
    a photoelectric conversion part affecting electric charges in accordance with a received amount of X-ray energy;
    a pixel electrode for collecting the electric charges;
    a storage capacitor for storing the electric charges collected in the pixel electrode, the storage capacitor having a first capacitor electrode, a dielectric layer on the first capacitor electrode, and a second capacitor electrode on the dielectric layer, the second capacitor electrode contacting the pixel electrode through a first contact hole formed in a protection film that covers the first and the second capacitor electrodes; and
    a switching part controlling release of the electric charges stored in the storage capacitor to an external circuit;
    wherein the switching part is covered by the dielectric layer, wherein the protection film is between the second capacitor electrode and the pixel electrode, and wherein the protection film is between the dielectric layer that covers the switching part and the pixel electrode.

2. An X-ray image sensor of claim 1, wherein an are of the first capacitor electrode is different than an area of the second capacitor electrode.

3. An X-ray image sensor of claim 1, wherein the second capacitor electrode of the storage capacitor is made of a transparent conducting material.

4. An X-ray image sensor of claim 3, wherein the transparent conducting material for the second capacitor electrode is indium tin oxide.

5. An X-ray image sensor of claim 1, wherein the switching part is a thin film transistor having gate, source and drain electrodes, the source electrode contacting the pixel electrode through a source island.

6. An X-ray image sensor of claim 5, wherein the source island is made of a transparent conducting material.

7. An X-ray image sensor of claim 6, wherein the transparent conducting material for the source island is indium tin oxide.

8. An X-ray image sensor of claim 1, wherein the protection film is an organic insulation film.

9. An X-ray image sensor of claim 8, wherein the organic insulation film is made of a material selected from the group consisting of BCB (benzocyclobutene), acrylic and polyamide.

10. An X-ray image sensor of claim 1, wherein the storage capacitor further comprises a ground line contacting the first capacitor electrode.

11. An X-ray image sensor of claim 10, wherein the pixel electrode contacts the second capacitor electrode through a second contact hole in the protection film over the ground line.

12. An X-ray image sensor of claim 10, wherein the ground line is located on the first capacitor electrode of the storage capacitor.

13. An X-ray image sensor of claim 10, wherein the first capacitor electrode is located on the ground line.

14. An X-ray image sensor, comprising:
    a photoelectric conversion part affecting electric charges in accordance with a received amount of X-ray energy;
    a pixel electrode for collecting the electric charges;
    a storage capacitor for storing the electric charges collected in the pixel electrode, the storage capacitor including a first capacitor electrode and a second capacitor electrode that are separated by a capacitor dielectric layer; and
    a thin film transistor for controlling release of the electric charges stored in the storage capacitor to an external circuit, the thin film transistor having gate, source and drain electrodes, and a gate insulating layer between the gate electrode and the source electrode and between the gate electrode and the drain electrode;
    wherein the pixel electrode extends over the thin film transistor, wherein a benzocyclobutene protection film covers the source and drain electrodes and the second electrode, wherein the first capacitor electrode is on the gate insulating layer, and wherein the gate insulating layer is of a different material than the capacitor dielectric layer.

15. An X-ray image sensor of claim 14, wherein the second capacitor electrode contacts the pixel electrode through a contact hole formed in the protection film over the second capacitor electrode.

16. An X-ray image sensor of claim 14, wherein the source electrode of the thin film transistor contacts the pixel electrode through a source island, thereby decreasing contact resistance between the source electrode and the pixel electrode.

17. An X-ray image sensor of claim 16, wherein the source island is made of transparent conducting material.

18. An X-ray image sensor of claim 17, wherein the transparent conducting material for the source island is indium tin oxide.

19. An X-ray image sensor of claim 14, wherein the gate electrode of the thin film transistor is two-layered.

20. An X-ray image sensor of claim 19, wherein a lower layer for the gate electrode is selected from a group consisting of aluminum and aluminum alloy, and an upper layer for the gate electrode is selected from a group consisting of molybdenum (Mo), tantalum (Ta), tungsten (W), niobium (Nb) and antimony (Sb).

21. A method for fabricating an X-ray image sensor, comprising:
    forming a gate electrode on a substrate;
    forming a first insulation film on the substrate while covering the gate electrode;
    forming a source island and first capacitor electrode on predetermined positions of the first insulation film;
    forming an active layer on the first insulation film over the gate electrode such that the active layer overlaps one end of the source island;
    forming on the active layer, a drain electrode and a source electrode contacting a portion of the source island, and forming a grounding line on the first capacitor electrode;
    depositing a second insulation film on the first capacitor electrode while covering the ground line and the source and drain electrodes;
    forming a second capacitor electrode on the second insulation film over the first capacitor electrode;
    depositing an organic protection film on the second insulation film and on the second capacitor electrode;
    forming contact holes by etching the organic protecting and the second insulating film so that a portion of the source island and source electrode, and a portion of the second capacitor electrode are exposed;

forming on the organic protecting film, a pixel electrode in contact with the source island and source electrode and the second capacitor electrode though the contact holes, forming a photoconductive film on the pixel electrode; and forming a conductive electrode on the photoconductive film.

22. A method of claim 21,.wherein the organic protecting film is made of a material selected from the group consisting of BCB (benzocyclobutene), acrylic and polyamide.

23. A method of claim 21, wherein the pixel electrode is formed on the organic protecting film while extending over the active layer.

24. A method of claim 21, wherein the gate electrode is two-layered.

25. A method of claim 21, wherein an area of the second capacitor is different from an area of the first capacitor electrode and vice versa.

26. A method for fabricating an X-ray image sensor, comprising:

forming a gate electrode on a substrate;

forming a first insulation film on the substrate while covering the gate electrode;

forming an active layer on the first insulation film over the gate electrode;

forming a drain electrode and a source electrode on the active layer, and a ground line on the first capacitor electrode;

forming a source island overlapping the source electrode, and a first capacitor electrode covering the ground line on the first insulating film;

depositing a second insulation film on the first capacitor electrode while covering the ground line and the source and drain electrodes;

forming a second capacitor electrode on the second insulation film over the first capacitor electrode;

depositing an organic protection film on the second insulation film and on the second capacitor electrode;

forming contact holes by etching the organic protection film and the second insulating film so that a portion of the source island and source electrode and a portion of the second capacitor electrode are exposed;

forming on the organic protecting film, a pixel electrode in contact with the source island and source electrode and the second capacitor electrode though the contact holes, forming a photoconductive film on the pixel electrode; and forming a conductive electrode on the photoconductive film.

27. A method of claim 26, wherein the organic protecting film is made of a material selected from the group consisting of BCB (benzocyclobutene), acrylic and polyamide.

28. A method of claim 26, wherein the pixel electrode is formed on the organic protecting film while extending over the active layer.

29. A method of claim 26, wherein the gate electrode is two-layered.

30. A method of claim 26, wherein an area of the second capacitor is different from an area of the first capacitor electrode.

* * * * *